United States Patent

[11] 3,560,768

[72] Inventor Hans-Georg Rimkus
Nurnberg, Germany

[21] Appl No 720,577
[22] Filed Apr. 11, 1968
[45] Patented Feb. 2, 1971

[73] Assignee Grundig E.M.V. Elektro-Mechanische Versuchsanstalt Inh.
Max Grundig Fuerth (Bayer), Germany

[54] CONTROL CIRCUIT FOR A LOW-FREQUENCY AMPLIFIER
7 Claims, 2 Drawing Figs.

[52] U.S. Cl. .......... 307/264, 307/235, 307/251, 307/310, 307/321
[51] Int. Cl. .......... H03b 3/02
[50] Field of Search .......... 307/264, 235, 237, 251, 253, 297, 310, 321; 330/29; 325/410, 397; 323/19

[56] References Cited

UNITED STATES PATENTS

| | | | |
|---|---|---|---|
| 3,178,619 | 4/1965 | Winchel | 307/235X |
| 3,188,554 | 6/1965 | Reid | 307/237X |
| 3,193,709 | 7/1965 | Baxter et al. | 307/297X |
| 3,239,723 | 3/1966 | Washington et al. | 307/297X |
| 3,428,884 | 2/1969 | Nordahl | 323/19 |
| 3,454,789 | 7/1969 | Tyler et al. | 307/235 |

FOREIGN PATENTS

| | | | |
|---|---|---|---|
| 235,596 | 9/1964 | Germany | 307/264 |

*Primary Examiner*—Stanley T Krawczewicz
*Attorney*—Michael S. Striker

ABSTRACT: A low-frequency input voltage is fed to a voltage divider consisting of a fixed resistor and a pair of diodes connected in parallel but with opposite polarity with respect to AC but series-connected with respect to DC. The output voltage is derived from the DC common point of the two diodes and is thus a function of the impedance of said diodes. The impedance of the diodes is controlled as follows:

A voltage proportional to the input voltage, after passing a threshold stage, is used to charge a capacitor. The capacitor circuit has a short charging time and a long discharge time. The capacitor voltage constitutes the voltage at the gate of a field effect transistor, the voltage at whose drain electrode is used to control the impedance of the diodes. A circuit for compensating for temperature effects on the impedance of the diodes by inserting a DC voltage in the diode circuit is also shown.

INVENTOR
H. G. RIMKUS
BY
Michael S. Striker
ATTORNEY

CONTROL CIRCUIT FOR A LOW-FREQUENCY AMPLIFIER

BACKGROUND OF THE INVENTION

This invention relates to an automatic control circuit for controlling the input to a transistorized amplifier. In particular, this type of control circuit finds application in audio amplifiers.

In driving a low-frequency amplifier, as for example an amplifier in a tape recorder, it often becomes necessary to avoid overdriving said amplifier for a high audio input. Thus, automatic volume control circuits may be used which automatically increase the gain for low amplitude signals and decrease the gain for excessively high input signals. However, the difficulty arises, when sound recordings are made, that contrast which may be essential in a musical composition is lost through the automatic volume control. Therefore a circuit becomes desirable in which the gain does not automatically increase when a low amplitude audio signal immediately follows a high amplitude signal.

In order to achieve the type of control discussed above, a circuit with the following constants becomes desirable:

Response time equal or less than 200 milliseconds;

Control time constant equal to or greater than 180 seconds; and

Gain control range equal to or greater than 40 dB. Here the control time constant refers to the time required for the gain to change a specified amount (for example from a reduction of 40 dB to 31.4 dB) upon changes in the input signal.

The difficulties in meeting the above specifications in a transistorized amplifier are twofold. First, the input impedance of the usual transistors is very low. Second, the electrolytic condensers used in this application have high leakage currents. Also, the nonlinearity of the transistor characteristics often results in distortion when a gain control range as specified above is to be achieved by direct control of transistors.

SUMMARY OF THE INVENTION

This invention is a transistorized automatic regulating circuit adapted to furnish a regulated output voltage in response to a varying input voltage. It comprises voltage divider means for dividing said input voltage, said voltage divider means having fixed impedance means and variable impedance means, adapted to furnish said regulated output voltage at the common point of said fixed and variable impedance means, and connected in such a manner that the impedance of said variable impedance means varies as a function of a control voltage. It further comprises means for furnishing a second voltage proportional to said input voltage. A charging capacitor, having a capacitor voltage proportional to the charge thereon and unidirectional charging means for charging said capacitor in a short charging time in response to said second voltage, but adapted to retard discharge of said capacitor so that the same has a long discharge time, are also present. Finally, high input impedance transistor means, responsive to said capacitor voltage and adapted to furnish said control voltage as a function of said capacitor voltage are supplied, said control voltage being the transistor output voltage.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DESCRIPTION OF THE PREFERRED EMBODIMENTS

Figure 1:
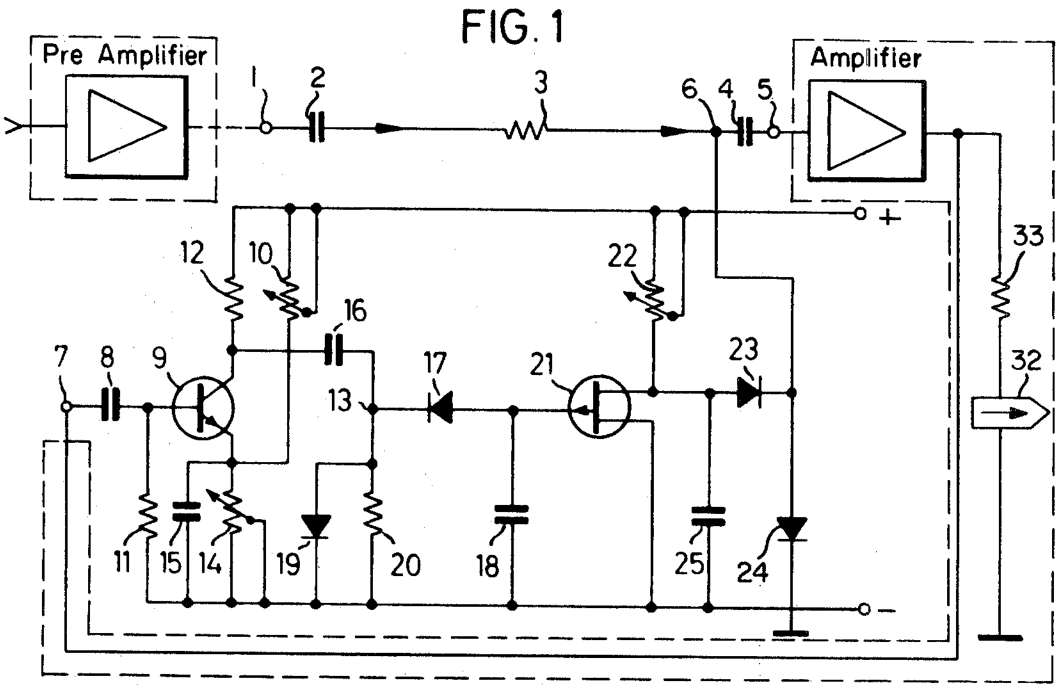
FIG. 1 is a schematic diagram of the control circuit according to this invention.

The operation of the circuit will be described with reference to FIG. 1. The low-frequency input voltage which is to be regulated is applied at terminal 1 of FIG. 1. Terminal 1 is coupled to terminal 5, at which the output voltage appears, by means of capacitor 2 and resistance 3, as well as coupling capacitor 4. A second voltage, proportional to the input voltage, is applied at terminal 7. It is applied to the base of a transistor 9 by means of capacitor 8. Transistor 9 operates as a threshold stage, whose base is connected to the negative supply voltage terminal by means of resistor 11. The negative supply voltage also constitutes the reference potential. The emitter of transistor 9 is connected to the negative supply voltage terminal by means of variable resistance 14 and capacitor 15 which is in parallel with said variable resistor 14. The emitter is also connected to the positive supply voltage terminal by means of variable resistance 10.

The collector of transistor 9 is connected to the positive supply voltage terminal by means of a resistance 12. The voltage appearing at this collector is applied to the charging capacitor 18 by means of capacitor 16 and diode 17. Charging capacitor 18 is in turn directly connected to the base of a field effect transistor 21. This field effect transistor 21 acts as a DC amplifier. Diode 19 in combination with resistance 20 is used to maintain a constant voltage level at point 13 of the arrangement of FIG. 1.

The source electrode of field effect transistor 21 is directly connected to the negative supply voltage terminal, while the drain electrode is connected to the positive supply voltage terminal by means of a variable resistance 22. The drain electrode is further connected with the anode of diode 23. Diode 23 is connected in parallel with diode 24, but with opposite polarity, with respect to alternating current voltages. Capacitor 25 serves to connect the drain electrode to the reference potential with respect to alternating current.

The regulated low-frequency voltage appearing at point 6 of voltage divider consisting of elements 3, 23 and 24 is fed to output terminal 5 by means of capacitor 4. If necessary, it undergoes further amplification, and is then fed to the sound-recording head of the tape recorder. Resistances 14 and 10 in the threshold stage may be so adjusted that the voltage appearing at point 6 is enough to fully drive the tape. The slope of the response may be adjusted by means of emitter resistor 14.

A further consideration in connection with this type of control circuit is the temperature behavior. In this respect it must be taken into consideration that the diode characteristics change as a function of temperature and that therefore the voltage divider ratio of the voltage divider may undergo unwanted variations because of changes of temperature.

It is a further object of the present invention to substantially decrease the temperature dependence of the control circuit. This may be accomplished in a simple manner by inserting a compensation voltage in series with the terminal of diode 24 which is connected to the reference potential. This compensation voltage must be such as to counter the changes in the diode characteristic which appear because of temperature changes.

Figure 2:
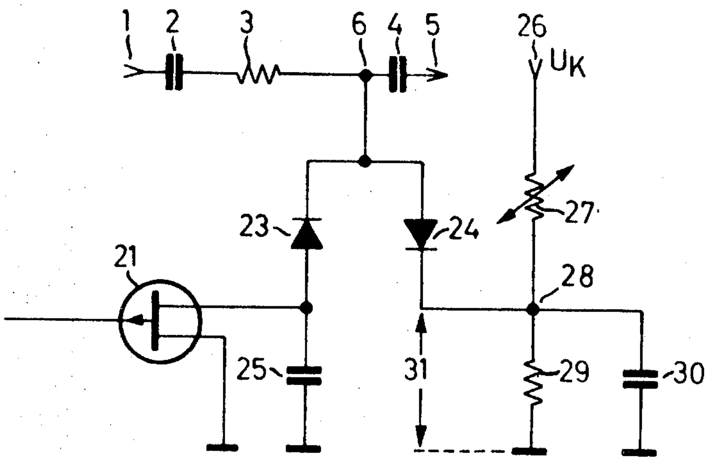
FIG. 2 is a schematic diagram of a circuit for temperature compensation.

The temperature compensation may be accomplished as shown in FIG. 2. A DC voltage, $U_K$, is introduced at terminal 26. This direct current voltage $U_K$ is connected to the negative supply voltage, or reference voltage, by means of a temperature dependent resistor 27 and a further resistor 29 in parallel with a capacitor 30. By connecting the cathode of diode 24 to the common point 28 of the temperature dependent resistor 27 and fixed resistor 29, a compensation voltage which is dependent on temperature is introduced into the diode circuit to counteract the changes of diode characteristic caused by temperature changes.

If the circuit of FIG. 1 is examined in more detail, it will be found that the response time, $t_1$, depends on the internal impedance of transistor 9 (Ri 9) the forward impedance of diode 17, the resistances 12 and 20, and the capacitance of the charging capacitor. It may be computed by the formula:

$$t_1=\left(\frac{1}{\frac{1}{Ri9}+\frac{1}{R12}+\frac{1}{R20}}+R_{D\ 17}\right)C_{18}$$

For computation of the control time constant (or the discharge time constant), $t_2$, the capacitance of charging capacitor 18, the input impedance of field effect transistor 21 ($R_{G21}$) and the reverse impedance of diode 17 ($R_{sp17}$), must be considered. The following equation applies:

$$t_2=\frac{C_{18}}{\frac{1}{R_{G\ 21}}+\frac{1}{R_{SD\ 17}}}$$

If capacitor $C_{18}$ = 1 $\mu$F, input impedance $R_{G\ 21} = 3\times10^9$ ohms, and reverse impedance of the diode $R_{sp\ 17}$ has the same value, then a regulation time constant $t_2 = 1.5\times10^3$ seconds results. Since the above values of the elements were taken at a temperature of 25° C., the regulation time constant at a temperature of 60° may be decreased to 500 seconds. Thus it is seen that the desired regulation time constant may be achieved without difficulty by proper choice of the components.

While the invention has been illustrated and described as embodied in a control circuit using a field effect transistor, it is not intended to be limited to the details shown, since various modifications and circuit changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

I claim:

1. A transistorized regulating circuit for furnishing a regulated output voltage at an output terminal in response to a varying input voltage applied at a first input terminal, comprising, in combination, a second input terminal; means connected between said output terminal and said second input terminal for furnishing a second voltage proportional to said output voltage at said second input terminal; a charging capacitor having a capacitor voltage proportional to the charge thereon; unidirectional charging means connected between said second input terminal and said charging capacitor, in such a manner that said capacitor charges in a short-charging time in response to said second voltage, but has a long discharge time; high input impedance transistor means having a control electrode connected to said charging capacitor for furnishing a transistor output voltage at a transistor output terminal as a function of said capacitor voltage; and voltage divider means comprising fixed impedance means and variable impedance means connected at a common point, said voltage divider means interconnecting said first input terminal, said output terminal and said transistor output terminal in such a manner that the impedance of said variable impedance means caries as a function of said transistor output voltage, and that said output voltage corresponds to a portion of said input voltage determined by the impedance of said variable impedance means.

2. A circuit as set forth in claim 1, wherein said high impedance transistor means comprise a field effect transistor having a gate and a drain and a source electrode, and wherein said gate is connected to said charging capacitor and the voltage at said drain electrode constitutes said transistor output voltage.

3. A circuit as set forth in claim 2, wherein said variable impedance means comprises a first and second diode, DC series connected at said common point, said series connection having a first and second terminal; and connecting means connecting said first terminal to said drain electrode.

4. A circuit as set forth in claim 3, also comprising means for furnishing a DC voltage varying as a function of temperature; and means for applying said DC voltage to said second terminal of said DC series-connected diodes, thus causing the effective impedance of said diode circuit to become substantially independent of temperature.

5. A circuit as set forth in claim 1, also comprising means for compensating for changes in said variable impedance means caused by temperature changes.

6. A circuit as set forth in claim 1, further comprising a threshold stage connected to said second input terminal and responsive to a predetermined magnitude of said second voltage.

7. A circuit as set forth in claim 1, wherein the capacitance of said charging capacitor is substantially equal to one microfarad.